US006344417B1

(12) United States Patent
Usenko

(10) Patent No.: US 6,344,417 B1
(45) Date of Patent: Feb. 5, 2002

(54) METHOD FOR MICRO-MECHANICAL STRUCTURES

(75) Inventor: Alexander Usenko, Murray Hill, NJ (US)

(73) Assignee: Silicon Wafer Technologies

( * ) Notice: Subject to any disclaimer, the term of this patent is extended or adjusted under 35 U.S.C. 154(b) by 0 days.

(21) Appl. No.: 09/634,444

(22) Filed: Aug. 8, 2000

Related U.S. Application Data

(60) Provisional application No. 60/183,360, filed on Feb. 18, 2000.

(51) Int. Cl.[7] .............................................. H01L 21/302
(52) U.S. Cl. ........................ 438/733; 438/734; 438/739; 438/749; 438/753
(58) Field of Search .............................. 117/2; 438/733, 438/734, 739, 749, 753

(56) References Cited

U.S. PATENT DOCUMENTS

| 5,374,564 A | | 12/1994 | Bruel |
| 5,882,987 A | * | 3/1999 | Srikrishnan ................. 438/455 |
| 6,020,272 A | | 2/2000 | Fleming |

OTHER PUBLICATIONS

J. M. Bustillo, R. T. Howe, R. S. Muller, Surface Micromachining for Microelectromechanical Systems, Proceedings of the IEEE, vol. 86, No. 8, (1998), pp. 1552–1574.
M. Biebl, T. Scheiter, C. Hierold, H.v. Philipsborn, H. Klose, Micromechanics Compatible with an 0.8 micrometer CMOS Process, Sensors and Actuators A V. 46–47 (1995) 593–597.
C. H. Yun, A. B.Wengrow, N. W.Cheung, "Transfer of patterned ion–cut silicon layers", Applied Physics Letters, vol. 73, No. 19, pp. 2772–2774, 1998.

* cited by examiner

Primary Examiner—Felisa C. Hiteshew
(74) Attorney, Agent, or Firm—DeMont & Breyer

(57) ABSTRACT

A method for fabricating MEMS wherein a structural member is released without using a sacrificial layer. In one embodiment, the method comprises forming a buried hydrogen-rich layer in a semiconductor substrate, defining a release structure in the semiconductor substrate above the buried hydrogen-rich layer, and separating at least a portion of the release structure from the semiconductor substrate by cleaving the semiconductor substrate at the buried hydrogen-rich layer. The method can be used to fabricate hybrid devices wherein a MEMS device and a semiconductor device are formed on the same chip.

22 Claims, 12 Drawing Sheets

METHOD FOR MICRO-MECHANICAL STRUCTURES

STATEMENT OF RELATED CASES

This application claims priority of provisional patent application serial No. 60/183,360, filed Feb. 18, 2000 and entitled "Process for Release of Micro-mechanical Structures," which is incorporated by reference herein.

FIELD OF THE INVENTION

The present invention relates generally to micro-electromechanical systems (MEMS). More particularly, the present invention relates to a fabrication method for MEMS devices and for integrating, on a single chip, MEMS devices and semiconductor devices (e.g., CMOS, etc.).

BACKGROUND OF THE INVENTION

Surface micro-machining is a common processing technique for fabricating MEMS structures. Such structures have dimensions on the order of tens of microns. Typical surface micro-machining processing steps are illustrated via FIGS. 1A–1C, which depict the fabrication of a simple MEMS structure (i.e. a cantilevered beam).

A first processing step involves forming a layered structure by depositing various layers on a substrate—typically crystalline silicon. The deposited layers usually include alternating layers of: (1) a sacrificial layer, such as silicon dioxide, and (2) a mechanical/structural layer, such as polysilicon or silicon nitride. The number of deposited layers varies as a function of the complexity of the device, etc. For the basic structure shown in FIG. 1A, only one sacrificial layer 102 and one mechanical layer 104 are required on substrate 100.

In a second processing step, either one or both of the sacrificial and mechanical layers are "patterned." Patterning typically defines the final shape of the mechanical layer(s). In FIG. 1B, mechanical layer 104 is patterned wherein a portion of it (i.e., region 106) is removed via photolithography. Photolithographic steps, which are well-known in the art, involve depositing photoresist on a layer, exposing the photoresist to UV through a mask that defines the pattern that is to be reproduced in the mechanical layer, and then etching to actually form the desired shape or pattern in the mechanical layer.

In a third processing step, the mechanical layer is "released," wherein it becomes separated, at least in part, from the underlying sacrificial layer. As a consequence of such release, the mechanical layer becomes movable. FIG. 1C depicts a released structure, wherein a portion of sacrificial layer 102 is etched away, using, for example, KOH, TMAH, or HF. As a result of etching, cantilevered portion 108 of mechanical layer 104 is formed, wherein gap 112 separates cantilevered portion 108 from substrate 100. The remaining portion 110 of sacrificial layer 102 supports mechanical layer 104. See Bustillo et al., "Surface Micromachine for Microelectromechanical Systems", Proceedings of IEEE, vol.86, No.8, pp.1552–1574, 1998.

A wide range of MEMS structures have been made using the conventional surface micro-machining method described above. Nevertheless, this process has certain limitations that are due, at least in part, to the use of a sacrificial layer (i.e., the necessity of having to etch the sacrificial layer to release the mechanical layer). Such limitations include:

A limited ability to integrate, on single chip, micromechanical devices with semiconductor devices (e.g., CMOS, etc.). In particular, semiconductor devices are usually damaged by sacrificial-layer etchants, so semiconductor devices cannot be fabricated before micro-mechanical devices unless they are protected, such as by the application of photoresist or other materials during fabrication. See U.S. Pat. No. 6,020,272 to Fleming. And released micro-mechanical devices cannot survive the high temperature processing typical for semiconductor-device fabrication, so semiconductor devices cannot be fabricated after micro-mechanical device fabrication. But see, e.g., Biebl et al., "Micromechanics compatible with a 0.8 micro-meter CMOS Process," Sensors and Actuators A, vol.47, No.1–3, pt.4, pp.593–597, 1995 and Bustillo et al., above.

A limited ability to fabricate micro-mechanical parts from crystalline silicon, which, in many MEMS applications, is preferable to using polysilicon because of its better uniformity and mechanical properties (e.g., relative to single crystal silicon, the granularity of polysilicon results in lower mechanical strength and inferior electronic properties). In the prior art, if crystalline silicon were to be used as the mechanical layer of a MEMS device, a silicon-on-insulator wafer would typically be used. Such silicon-on-insulator wafers are disadvantageously far more expensive than layered structures comprising polysilicon mechanical layers.

A limited area of continuously released mechanical structure. To release a large-area structure, a long lateral etching path is required. But, fresh etchant cannot readily be delivered far from the beginning of a lateral etching path.

The art would therefore benefit from an improved method for fabricating MEMS devices. Such a method would incorporate steps for the release of mechanical layers that avoid the drawbacks of the prior art.

SUMMARY OF THE INVENTION

In some embodiments, a method in accordance with the present invention provides a fabrication method for MEMS devices and hybrid MEMS/semiconductor devices that avoids the drawbacks of the prior art. In particular, in some embodiments, the method includes steps for the release of a structural member without the use of a sacrificial layer.

In some embodiments, a micro-mechanical structure is fabricated by:

forming a buried hydrogen-rich layer in a semiconductor substrate;

defining a release structure in the semiconductor substrate above the buried hydrogen-rich layer;

separating at least a portion of the release structure from the semiconductor substrate by cleaving the semiconductor substrate at the buried hydrogen-rich layer.

The buried hydrogen-rich layer is formed by any one of several methods, including conventional ion implantation. The operation of separating the release structure from the semiconductor substrate is performed by any one of several methods, including thermal treatment, that cause a change in the structure of the buried hydrogen-rich layer. The change, which is believed to involve the conversion of the buried layer into a continuous gaseous layer, results in cleavage of the semiconductor. The semiconductor substrate is advantageously mono-crystalline silicon.

Since the release step proceeds without the use of etchant, the present invention allows, or at least simplifies, the fabrication of "hybrid" devices in which a MEMS structure and a semiconductor device are fabricated in close proximity on the same chip. In particular, in accordance with some embodiments, a hybrid device is fabricated by proceeding with the fabrication of the semiconductor device until high temperature processing steps are complete. Semiconductor processing is thereafter suspended. MEMS fabrication procedures then begin, wherein a release structure is defined and a buried hydrogen-rich layer is formed in the substrate.

The semiconductor device and the MEMS device are then metalized. In particular, electrical contacts are formed for the semiconductor device and elements of the MEMS structure are metalized as appropriate. In some embodiments, metal that is deposited on the nascent release structure functions as a strained layer, a stiffener, and an electrical contact to the semiconductor device. The MEMS release structure is then released by adding energy to the buried hydrogen-rich layer.

In the practice of the present invention, there is no need to protect the semiconductor device (e.g., by applying a protective layer of photoresist that must be later stripped off) as in some prior art methods, since etchant is not used for the release step.

DETAILED DESCRIPTION

In accordance with the present teachings, release structures are fabricated via a method that includes hydrogen-induced cleavage of semiconductors. As used herein, the term "release structure" means a structure, such as a beam, a platform, a hinge, etc., that, while initially defined within a layer of material (e.g., silicon, etc.), such as by etching or other conventional techniques, becomes at least partially separated (i.e., "released") from the material such that the structure is free to move when actuated. When released, such structures form, for example, a cantilevered beam, a platform that is raised from a substrate but remains attached by several support legs, or a rotatable hinge, etc. The term "release structure" also encompasses structures that were defined within a layer of material and are then completely removed. A typical example is a gear that, after release, is moved to another substrate for assembly/engagement with other gears, etc. The release structure comprises only a portion of the substrate or wafer in which it is defined.

Hydrogen-induced cleavage of semiconductors is known in the art. U.S. Pat. No. 5,374,564 ("the '564 patent") describes using hydrogen-induced cleavage to prepare thin semiconductor films that are used, for example, to prepare silicon-on-insulator wafers. In an article entitled, "Transfer of Patterned Ion-Cut Silicon Layers," v. 73, n. 19, Appl. Phys. Letts., pp. 2772–2774, Nov. 9, 1998, authors Yun et al. use hydrogen-induced cleavage to cleave a layer of silicon from a first wafer and transfer it to a second wafer. According to the Yun, such layer transfer has applications for three-dimensional chip integration. Both of these publications are incorporated herein by reference.

In the context of the present invention, hydrogen-induced cleavage of semiconductors is used, in some embodiments, to cause a site-specific cleavage and, in some embodiments, partial cleavage of a semiconductor substrate. In some embodiments, such site-specific cleavage and partial cleavage are used to great advantage to form release structures, such as are defined in structural/mechanical layers, to fabricate a MEMS device. Using this technique avoids drawbacks associated with release via a sacrificial layer as described in the Background section of this Specification.

Figure 1A:
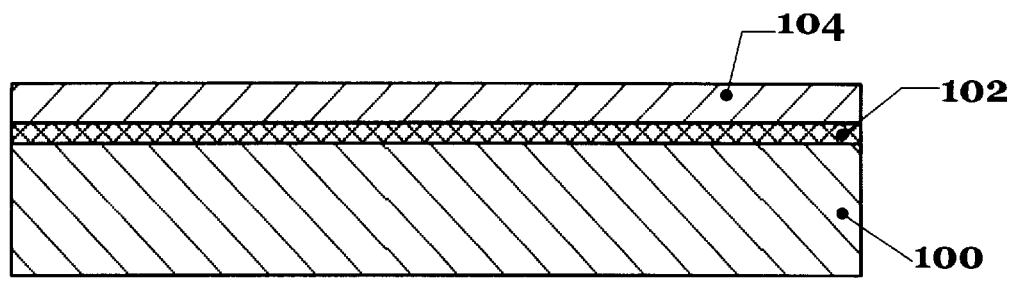
FIGS. 1A–1C depict conventional surface micro-machine operations for releasing a mechanical layer.
Figure 1B:
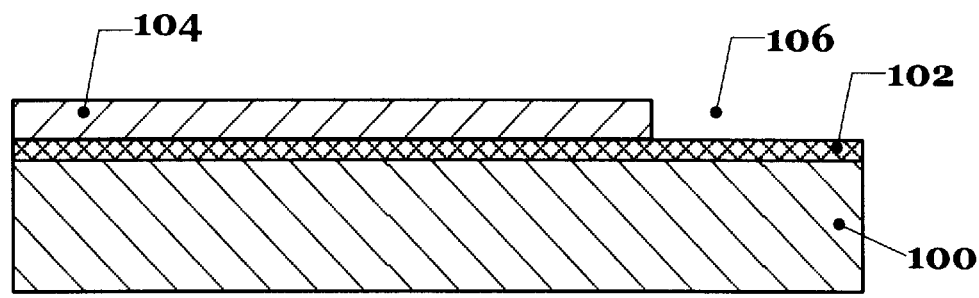
Figure 1C:
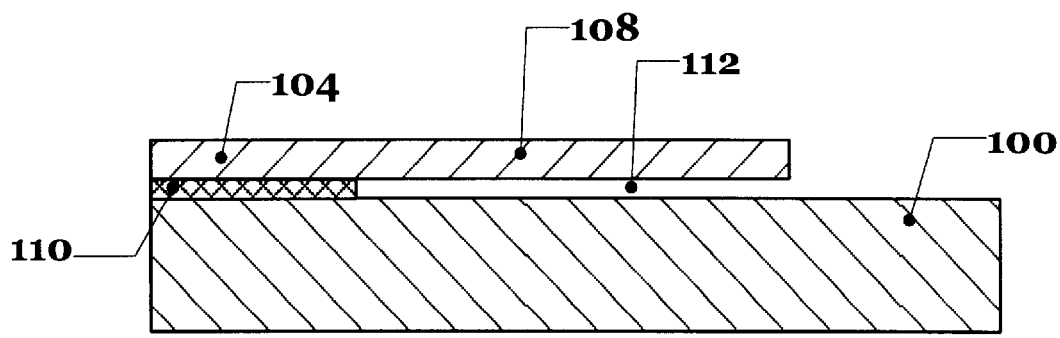
Figure 2:
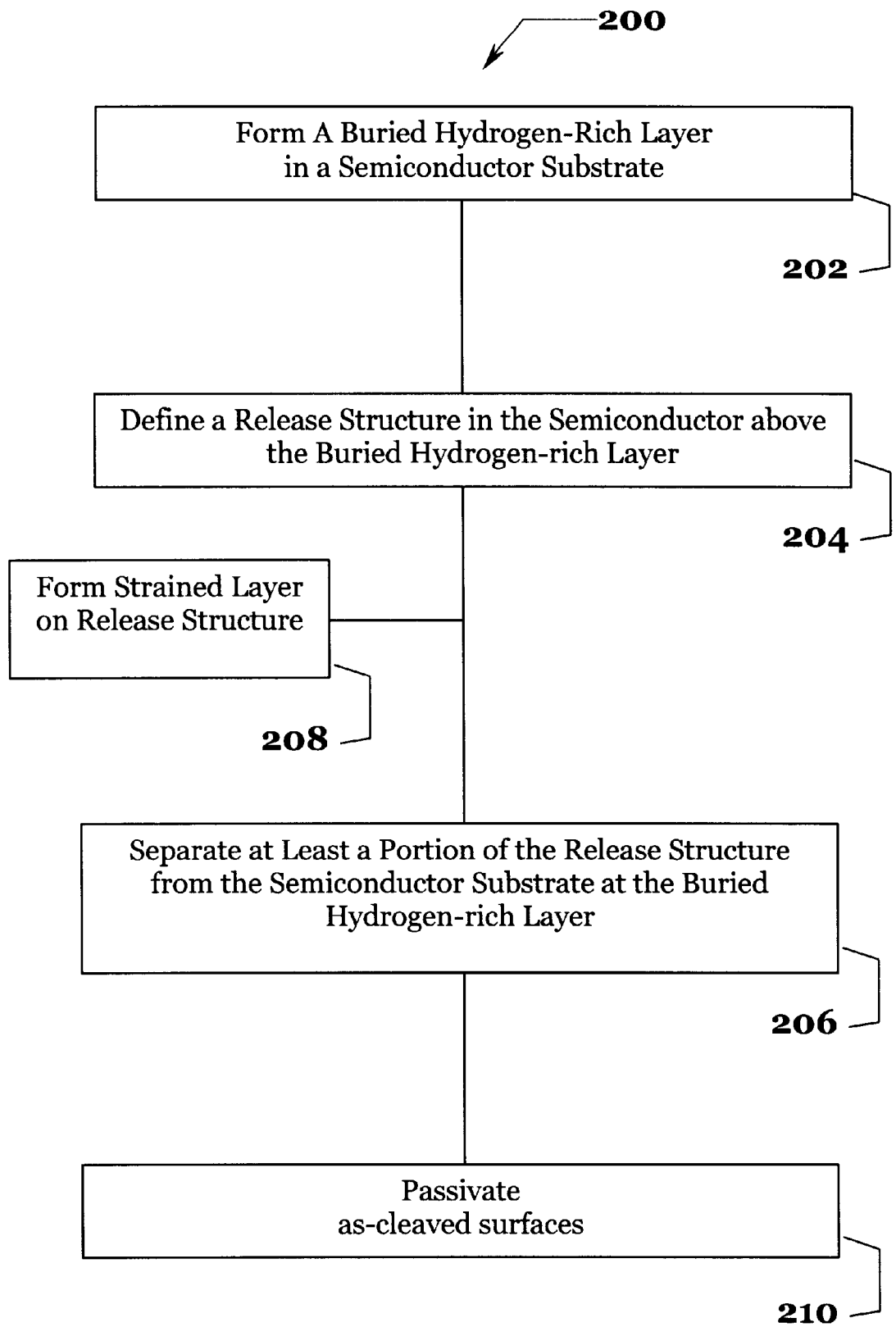
FIG. 2 depicts a flow diagram of a method in accordance with the illustrated embodiment of the present invention.

FIG. 2 depicts an embodiment of a method 200 for releasing a mechanical layer in a MEMS device in accordance with the present teachings. Method 200 is further illustrated with FIGS. 3A–3H, which depict stages in the fabrication of a MEMS device in application of the present method.

Figure 3A:
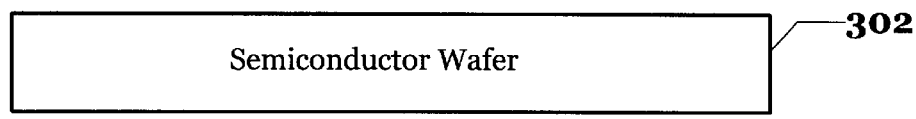
FIGS. 3A–3H depict stages in the fabrication of a micro-mechanical device using an embodiment of the method of FIG. 2.

FIG. 3A depicts a cross-sectional view semiconductor wafer 302 (cross-hatching omitted for clarity). The semiconductor is advantageously mono-crystalline silicon, and the description of the illustrative embodiment proceeds on this basis. Method 200 can, however, suitably be used in conjunction with other semiconductors, as well.

Figure 3B:
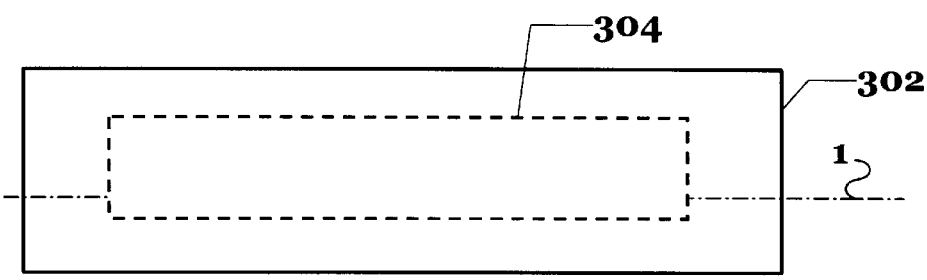
Figure 3C:
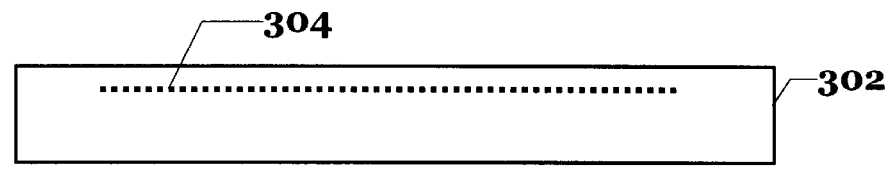

According to operation 202 of illustrative method 200 (FIG. 2), a buried hydrogen-rich layer is formed at a specific region (i.e., a specific depth, a specific lateral location, and to specific dimensions) in a semiconductor substrate. This operation is illustrated in FIGS. 3B and 3C, which depict buried hydrogen-rich layer 304. FIG. 3B shows a top view and FIG. 3C shows a side cross-sectional view through line 1—1 of FIG. 3B.

In conjunction with several other operations of illustrative method 200 that are described later in this Specification, the buried hydrogen-rich layer facilitates site-specific cleavage of a semiconductor (e.g., semiconductor wafer 302). In particular, in the illustrative embodiments of the present invention, the buried hydrogen-rich layer is limited in size and location to a region that corresponds in size, and is located below, the intended release structure. As used herein the term "site-specific cleavage" refers to cleaving only a portion of the semiconductor substrate or wafer; namely, the release structure. For cleavage to be "site specific" requires: (1) forming a localized buried hydrogen-rich layer—operation 202, and (2) defining the release structure—operation 204 (described below).

In one embodiment, the buried hydrogen-rich layer is formed by selectively implanting H+ ions into mono-crystalline silicon. During implantation, a flux of H+ ions that is greater than about $5 \times 10^{16}$ ions per square centimeter is advantageously used to insure that the hydrogen concentration profile within the mono-crystalline silicon corresponds to a plane that is substantially parallel to the surface of silicon. Lower fluxes of ions may result in a concentration profile that does not allow for the formation of a continuous gaseous layer as is required for cleavage.

During implantation, the energy of the H+ ions is advantageously about 100 KeV, which provides an implantation depth of about 1 micron. The implantation depth will dictate the thickness of the release structure. Increasing the energy of the protons increases implantation depth and decreasing the energy results in decreased implantation depth. Using $H_2^+$ or $H_2^{++}$ ions instead of $H^+$ ions further decrease the depth by a factor of about 2. See, e.g., the '564 patent. The temperature of the semiconductor (e.g., silicon, etc.) during implantation is in a range from about room temperature (i.e., 20° C.) to about 450° C.

Selective implantation (i.e., limiting implantation to a defined region) is suitably performed using conventional methods. In one such method, a layer of photoresist having a thickness that is sufficient to prevent ions from penetrating the semiconductor is deposited thereon. For example, for H+ ions having an energy of about 100 KeV, a layer of photoresist having a thickness of about three microns is suitable for preventing ion penetration.

The photoresist is exposed (typically with UV light) through a suitably configured mask and then developed. As a result, openings are created through the photoresist down to the semiconductor at regions that overlie the locations at which the buried hydrogen-rich layer is to be established. Ions are implanted through the openings and then the photoresist is removed. See, e.g., Yun et al.

In a further embodiment, the buried hydrogen-rich layer is formed by creating a gettering or trap layer and then inserting hydrogen into the trap. In one embodiment, the hydrogen trap layer is formed by implanting an element in the substrate to obtain a buried amorphous layer. The implanted element is advantageously the same element that comprises the substrate (e.g., silicon for a silicon substrate). Hydrogen is inserted into the trap using any of several techniques including, for example, electrolysis and exposure to RF hydrogen plasma To insert hydrogen via electrolysis, an electrolytic cell is prepared. The semiconductor substrate serves as the cathode of the electrolytic cell and the anode suitably comprises platinum or graphite. As current is applied, monatomic hydrogen is generated. The hydrogen diffuses into the substrate and saturates the preformed hydrogen traps.

The electrolyte for use in the cell is suitably selected from compounds that are either liquid, or soluble in water, and must dissociate and release monatomic hydrogen. Moreover, the electrolytes should have a high dissociation coefficient and must not damage the semiconductor substrate. When the substrate is silicon, strong acids satisfy the aforestated requirements and are advantageously used as the electrolyte. Illustrative strong acids that are suitable for use include, without limitation, sulfuric acid ($H_2SO_4$), hydrochloric acid (HCl) and hydrofluoric acid (HF).

To insert hydrogen via RF hydrogen plasma, the semiconductor substrate is placed in a chamber that is then filled with hydrogen. A RF power generator is used to generate monatomic hydrogen. The monatomic hydrogen diffuses into the substrate and saturates the preformed hydrogen traps.

The method described above for forming a buried hydrogen-rich layer by creating a trap and then saturating it with hydrogen is described in more detail in a copending patent application by the present inventor that was filed May 26, 2000 and entitled "Process for Lift-off of a Layer from a Substrate," incorporated by reference herein.

Figure 3D:
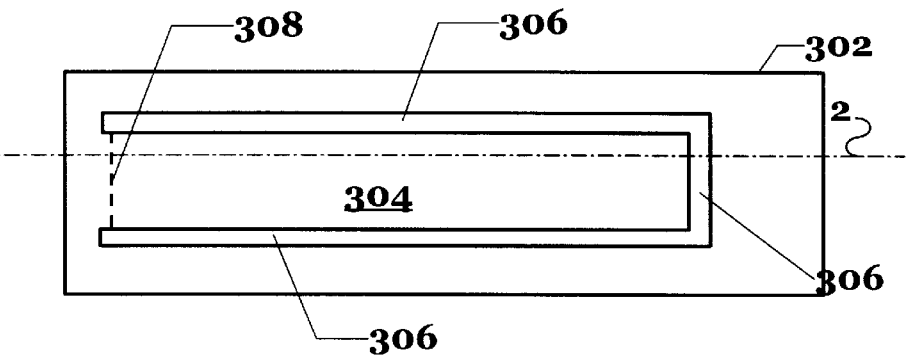
Figure 3E:
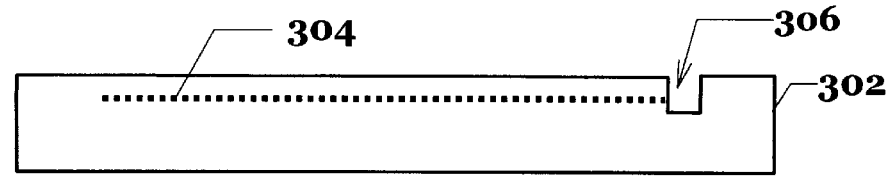

According to operation 204 of method 200 (FIG. 2), a release structure is defined in the semiconductor above the buried hydrogen-rich layer. In this operation, lateral features of the release structure are formed within the semiconductor, such as by etching or other conventional techniques for forming trenches. FIG. 3D depicts a top view of semiconductor wafer 302 showing trenches 306 that were etched therein. As is apparent from the view of FIG. 3D, the trenches define the shape of the release structure, which, in this embodiment, is a simple beam. FIG. 3E depicts a side cross-sectional view of semiconductor wafer 302 along line 2—2 of FIG. 3D.

As can be seen in FIG. 3D, semiconductor wafer 302 is etched along the edges of buried hydrogen-rich layer 304 except for edge 308. As a consequence, the release structure will remain tethered to semiconductor wafer 302 along that edge, forming a cantilevered beam. As depicted in FIG. 3E, trenches 306 extend at least as far into semiconductor wafer 302 as buried hydrogen-rich layer 304, ensuring that cleavage is precisely terminated.

In operation 206, the release structure is at least partially separated from the semiconductor substrate at the buried hydrogen-rich layer. Separation occurs as a result of transforming the buried hydrogen-rich layer into a substantially continuous gaseous layer or platelet, at least according to one current theory.

Thus, the operation of forming a buried hydrogen-rich layer creates a fracture plane in a semiconductor, which fracture plane is subsequently fractured thereby cleaving the semiconductor.

Transformation of the buried hydrogen-rich layer is effected applying energy thereto. The transformation energy is applied in any one of a variety of ways. In one embodiment, transformation results from heating the substrate to a temperature that exceeds 300° C., such as by placing the substrate in an oven. Alternate sources of transformation energy include, for example, ultrasound, hydrostatic pressure, hydrodynamic pressure, infrared light, mechanical energy and combinations thereof. To the extent possible, the transforming energy is applied in such a manner that it is preferentially absorbed by the hydrogen-rich layer. Further description concerning the aforementioned alternate sources of transformation energy is provided in a co-pending patent application filed on Apr. 6, 2000 as Ser. No. 09/543,998, and entitled "Separation Process for Silicon-On-Insulator Wafer Fabrication," incorporated by reference herein.

Figure 3F:
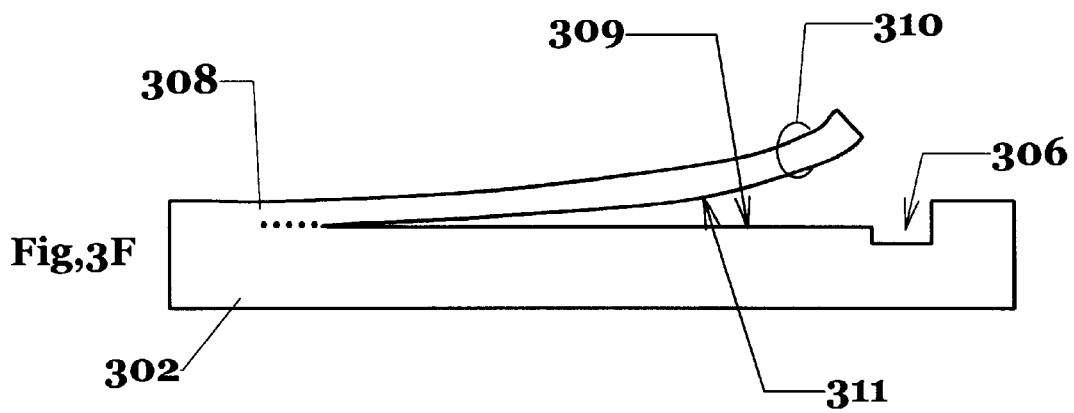

With reference to FIG. 3F, the extent of the area over which the release structure 310 is separated from the semiconductor substrate is limited by the dimensions of the originally implanted buried hydrogen-rich layer 304 (a relatively less precise delimiter of area) and by trenches 306 that were formed in operation 204 (a relatively more precise delimiter of area). Since edge 308 of buried hydrogen-rich layer 304 does not extend to the edge of substrate 302, and since the substrate was not trenched along edge 308, release structure 310 remains tethered to substrate 302.

In the conventional release technique, a gap or space is formed between the release structure and the substrate when the sacrificial layer that is disposed therebetween is removed. By virtue of the gap, the release structure is in an appropriate state for use (i.e., it is freely movable). By contrast, when the release structure and substrate are separated by hydrogen-induced cleavage, a gap is not formed since the gaseous layer or platelet(s) that are formed on transformation of the buried hydrogen-rich layer is substantially two-dimensional. In other words, the semiconductor is simply cleaved.

In the illustrative embodiment of a cantilevered beam (i.e., a single point of attachment to the substrate), the release structure is expected to be under relatively little if any stress after release. Consequently, in the absence of any force that causes the release structure to move away from the substrate, it will tend to remain in abutting relation with the substrate. In some applications, such contact may be acceptable. Moreover, in other embodiments in which a release structure remains attached to the substrate at several points of contact, a sufficient amount of stress may be generated within the release structure to cause it to rise off the substrate without any external applied force.

In some embodiments in which it is desirable to have the release layer move away from the substrate, it is desirable for such movement to happen immediately upon release. As used herein, the term "self releasing" or "self release" refers to such immediate movement away from the substrate. In one embodiment, self release is obtained by forming a "strained layer" on the release structure, as per optional operation 208. As used herein, the term "strained layer" refers to a layer of material that, after deposition on the release structure (i.e., the semiconductor), is under stress that generates an "upwardly"-directed force (i.e., a force that is directed away from the substrate/wafer). In some cases, the stress is generated after an additional operation (e.g., temperature cycling, etc.). That force will, of course, be applied to the release structure since the strained layer is disposed thereon, thereby causing the release structure to move away from the substrate simultaneously with the release of the release structure.

One way to create such stress is to select, for use as the strained layer, a material that has a different coefficient of expansion than the underlying release structure. In particular, a strained layer having a higher coefficient of expansion than the underlying release structure will, with appropriate temperature cycling, cause the release structure to move away from the substrate. For example, in one embodiment, metal, such as aluminum, is used as a strained layer for a silicon wafer. The metal is deposited onto the silicon at elevated temperature. The structure is then further heated to effect cleavage in accordance with the present teachings. After cleavage, the structure is allowed to cool. As the temperature of the release structure cools to a temperature that is below the metal deposition temperature, the relatively greater contraction of the metal layer as compared to the underlying silicon causes the release structure to move upwardly. Those skilled in the art will be able to select a material for use as a strained layer as a function of the material comprising the release structure Another way to create stress is to select, for use as the strained layer, a material that develops an intrinsic residual strain when deposited on the nascent release structure. Those skilled in the art are familiar with the use of a strained layer for such purpose and will be capable of suitably selecting materials for use in this service.

In still other embodiments, the release layer is moved away from the substrate by a variety of forces, including, without limitation, electrostatic forces, magnetic forces, capillary forces and external mechanical forces. In some of such other embodiments, however, the movement away from the substrate may not be immediate (i.e., not self-release).

Note that the strained layer may serve a dual role in that it also functions as a "stiffener." In particular, if the buried hydrogen-rich layer is less than about one micron beneath the surface of the substrate, blistering of the semiconductor substrate may occur. The presence of an overlying layer—a stiffener—prevents such blistering. See the '564 patent.

To prevent blistering, the combined thickness of the release layer and the strained layer should be at least about one micron. For example, if the release layer is about 0.5 microns in thickness, the strained layer, which is now functioning in a dual role as strained layer/stiffener, should be at least about 0.5 microns in thickness. If the release layer is about 1.25 microns in thickness, a stiffener is not required. Thus, if a strained layer is present, its ability to function as a stiffener is not required. And, if an alternative method for lifting the release layer is utilized such that a strained layer is not used (and the release layer is at least one micron in thickness), a separate stiffener layer is not required.

Figure 3G:
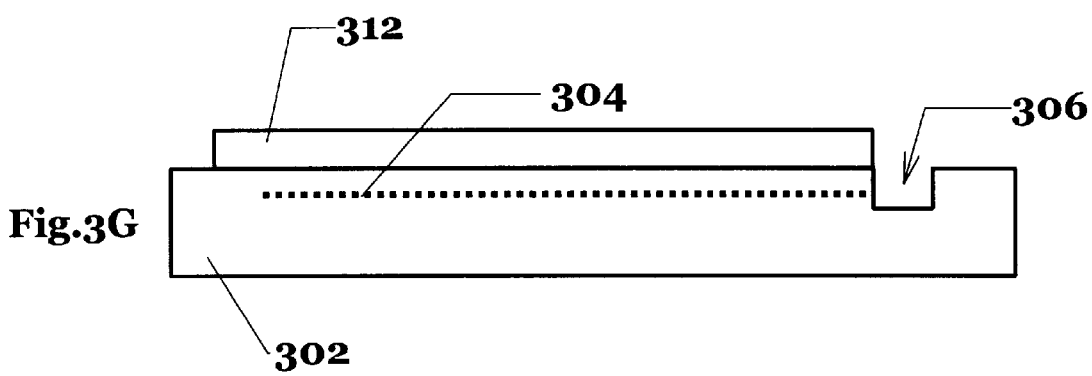
Figure 3H:
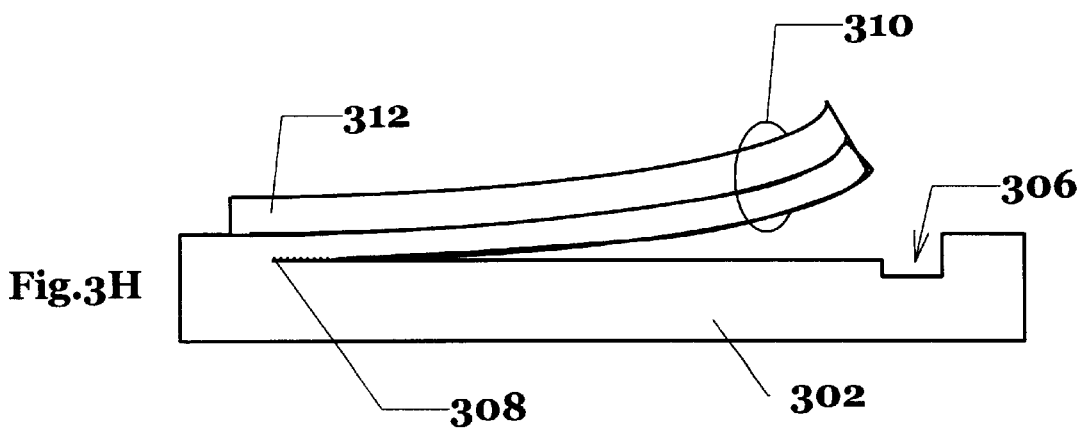

FIG. 3G depicts strained layer 312 disposed (after patterning) on what will be release structure 310. FIG. 3H depicts release structure 310, which comprises strained layer 312 and the released portion of substrate, separated from the bulk of the substrate 302.

Hydrogen-covered surfaces tend to have a high bondability. Consequently, in some embodiments, hydrogen is desorbed after structural release in accordance with operation 210. In one embodiment, such desorption is effected by exposing the substrate and release structure to a hydrogen-free atmosphere after release. For example, in some embodiments, the substrate and release structure are exposed to nitrogen or dry air. Since a free silicon surface is chemically quite active, it is substantially immediately covered with a layer of silicon dioxide on exposure to air. The layer is at least about 30 angstroms in thickness. The silicon dioxide is chemically passive, but nitrogen is physically adsorbed thereby. Since a nitrogen-covered surface does not have a high bondability, the tendency of released structures to stick to the substrate after nitrogen adsorption is reduced relative to when hydrogen is present.

The previous embodiments have been directed to fabricating relatively simple structures, such as a cantilevered beam. FIGS. 4A–4D depict the fabrication of a more relatively more complicated structure—tethered platform—using hydrogen-induced cleavage in accordance with the present teachings.

Figure 4A:
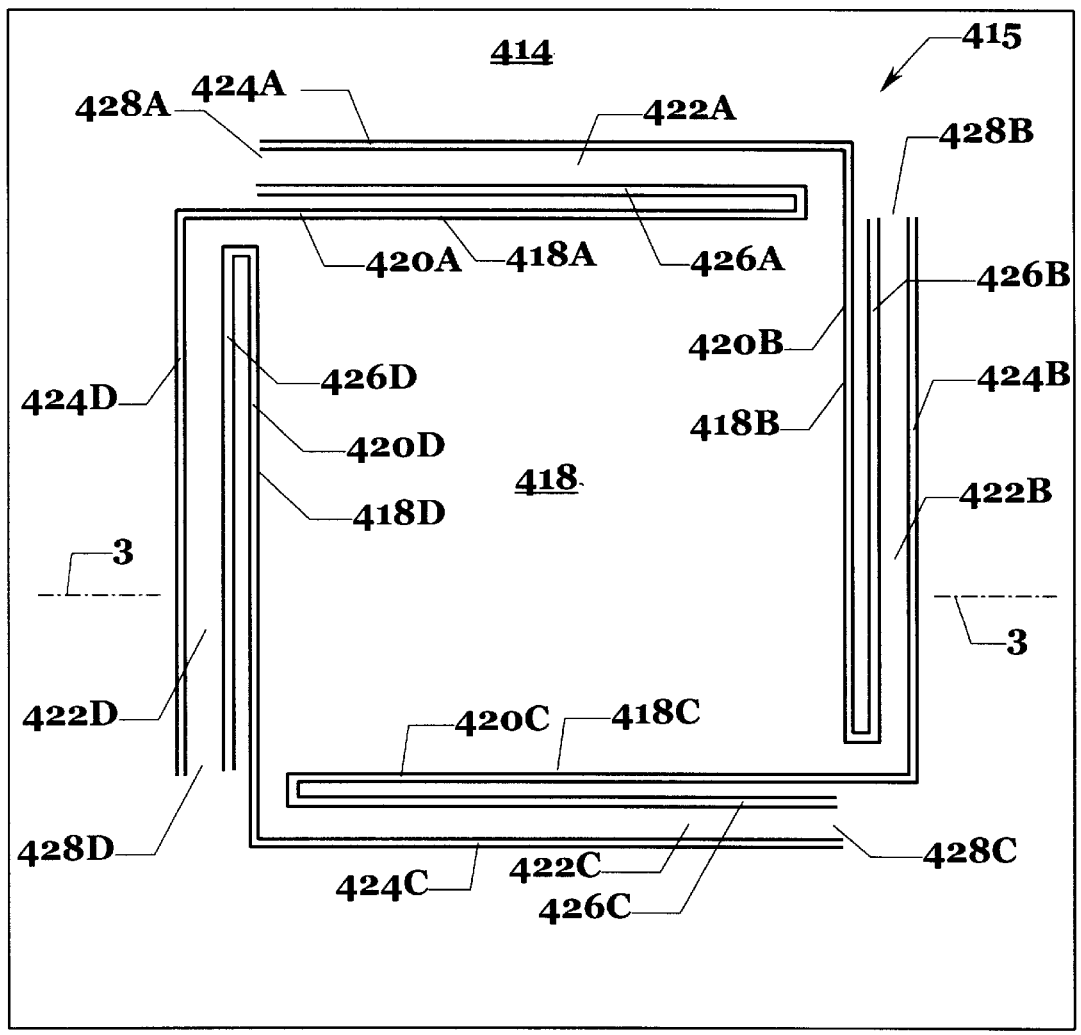
FIGS. 4A and 4B depict respective top and side cross-sectional views of a tethered platform before release, in accordance with the present teachings.
Figure 4B:
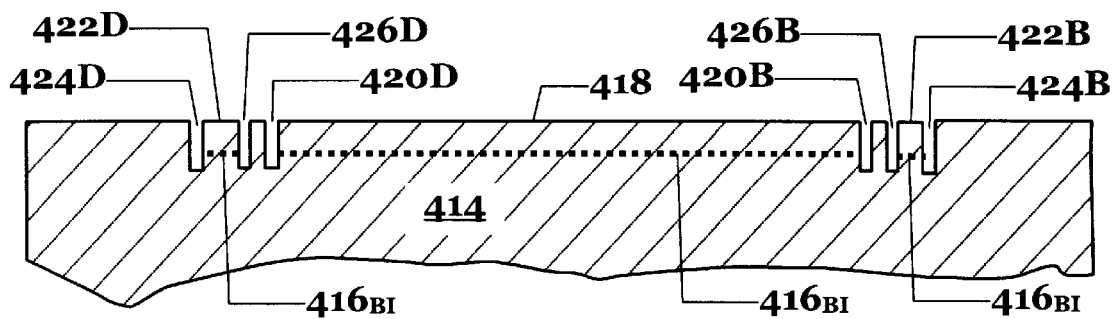

FIGS. 4A and 4B depict an illustrative tethered platform 415 before release. As depicted via a top view in FIG. 4A, tethered platform 415 includes platform portion 418 and support legs 422A, 422B, 422C and 422D. Tethered platform 415 is fabricated in accordance with method 200 (FIG. 2).

In particular, as depicted in FIG. 4B, which is a cross-section through FIG. 4A at line 3—3, buried hydrogen-rich layer $416_{BI}$ is formed in substrate 414. Hydrogen ions are selectively implanted in a region having the shape of tethered platform 415. In other words, buried hydrogen-rich layer $416_{BI}$ is present beneath the regions that will become the support legs 422A–422D and beneath platform portion 418. Such selective deposition is depicted in FIG. 4B, wherein buried hydrogen-rich layer $416_{BI}$ appears at only the appropriate locations.

The shape or features of tethered platform 415 is defined by a plurality of trenches. In particular, edge 418A of platform portion 418 is defined by trench 420A, edge 418B is defined by trench 420B, edge 418C is defined by trench 420C and edge 418D is defined by trench 420D.

Each support leg is defined by two trenches. Specifically, support leg 422A is defined by trench 424A and 426A, support leg 422B is defined by trench 424B and 426B, support leg 422C is defined by trench 424C and 426C and support leg 422D is defined by trench 424D and 426D. One end of each support leg 422A–422D remains sans trench. In particular, trenches are absent at end 428A of support leg 422A, end 428B of support leg 422B, end 428C of support leg 422C and end 428D of support leg 422D. It is at these ends that each support leg 422A–422D remains tethered to substrate 414.

Before release, a strained layer (not depicted for clarity) is advantageously deposited and patterned on support legs 422A–422D or on the support legs and platform portion 418. In the arrangement shown, tensile stress is reduced as the tethered platform 415 rises, facilitating self-release.

Figure 4C:
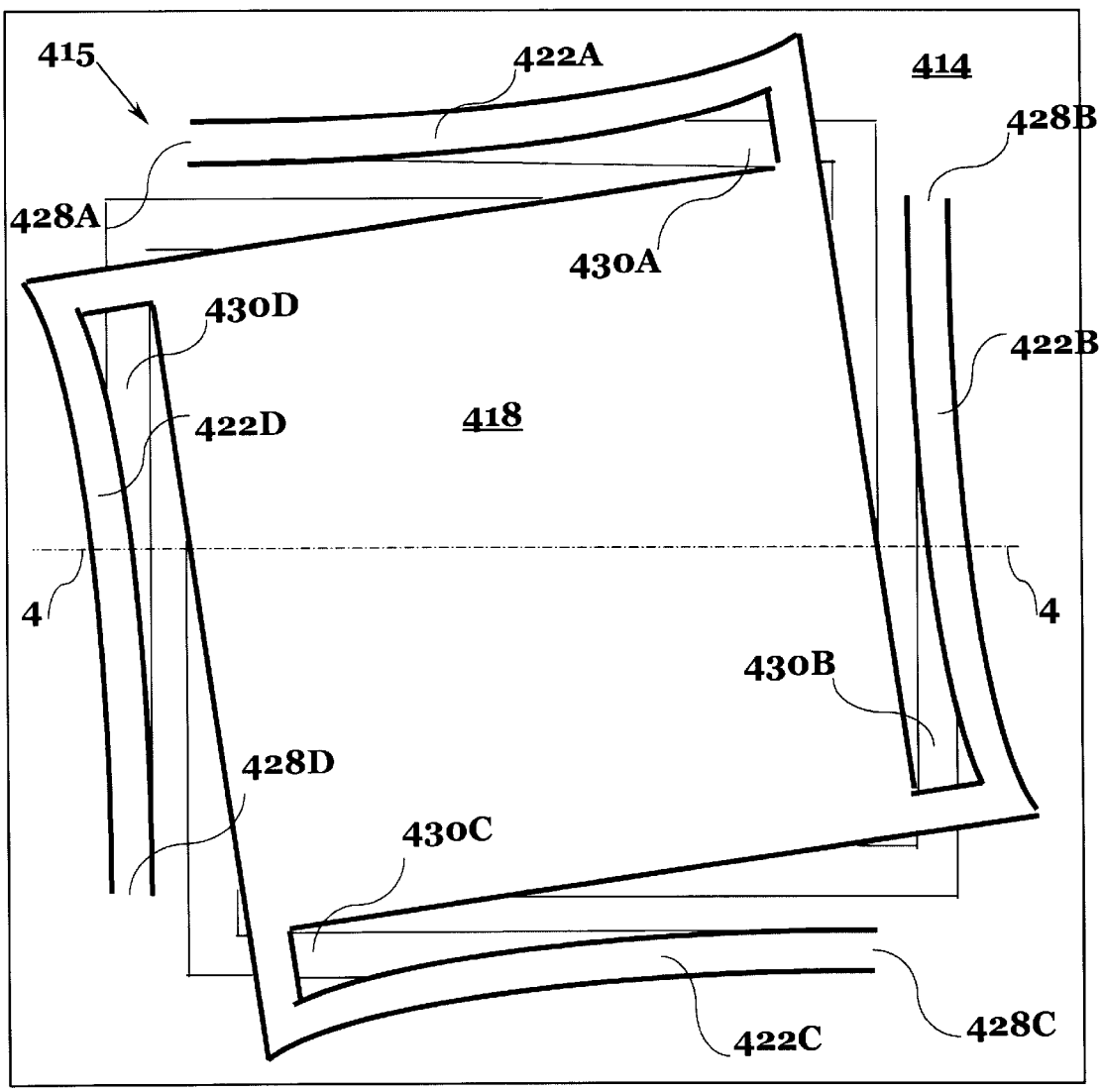
FIGS. 4C and 4D depict respective top and side cross-sectional views of the tethered platform of FIGS. 4A and 4B after release.
Figure 4D:
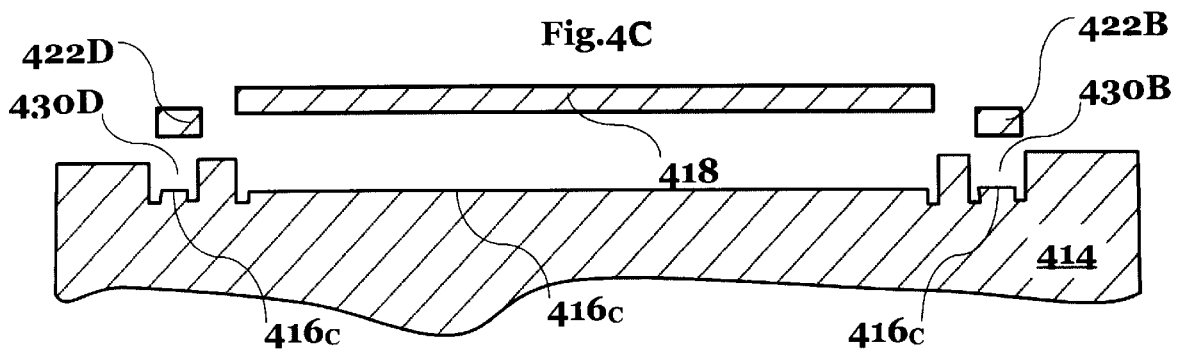

FIGS. 4C and 4D depict tethered platform 415 after release, such as results from the application of energy to substrate 414 so that buried hydrogen-rich layer 416B, is converted to a substantially continuous gaseous layer. As depicted in FIG. 4D, substrate 414 is cleaved at $416_C$, releasing platform portion 418 and support legs 422A–422D. Channels 430A–430D are created as support legs 422A–422D rise away from substrate 414.

Tethered platform 415 has a variety of uses including, without limitation, as a thermally insulated hotplate for applications such as hydrogen sensors, etc.

In further embodiments, hydrogen-induced cleavage for releasing MEMS structures becomes a powerful technique for the fabrication of "hybrid" devices, such as wherein a MEMS device and a semiconductor device are fabricated on the same substrate. As used herein, the term "semiconductor device" refers to devices and/or circuits that utilize the electrical/optical properties of semiconductors as a basis for operation but do not have movable parts (like MEMS devices). Illustrative semiconductor devices include bipolar devices, CMOS, BiCMOS, NMOS and other silicon-based electronics, as well as III–V devices (e.g., photo-detectors, quantum-well modulators, etc.). In some embodiments, the MEMS device is electrically connected to the semiconductor device.

In accordance with some embodiments, a hybrid device is fabricated by:
  fabricating the semiconductor device through high temperature processing steps, and then suspending semiconductor-device processing;
  fabricating the MEMS device, including forming a buried hydrogen-rich layer but not releasing the release structure;
  metalizing both the MEMS and the semiconductor devices, as required; and
  releasing the release structure by transforming the buried hydrogen-rich layer into a substantially continuous gaseous layer.

Since etchant is not required for the release step, the semiconductor device does not need to be protected, during the course of fabrication, by depositing a protective layer (e.g., photoresist). Moreover, the lack of any protective layers allows closer placement of the MEMS device to the semiconductor device.

During metalization, contacts to the semiconductor device are formed, and metal is advantageously deposited, as appropriate, on the nascent release structure. Depending upon application specifics, the metal that is deposited on the nascent release structure serves one, two or all of the following functions: (1) as a strained layer for self-release; (2) as a stiffener to prevent blistering; and (3) as an electrical connector to the semiconductor device.

Figure 5A:
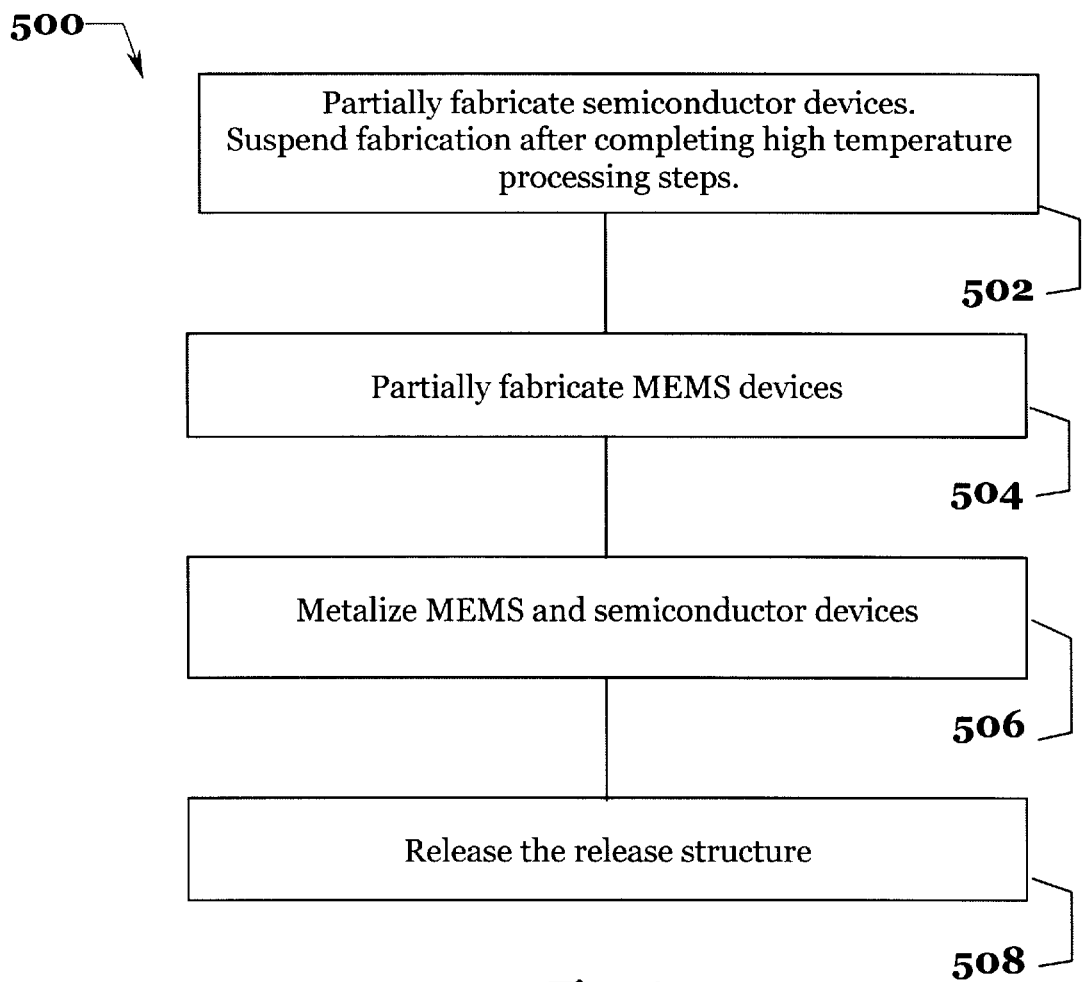
FIGS. 5A and 5B depict a method for fabricating a hybrid MEMS/semiconductor device in accordance with the present teachings.
Figure 5B:
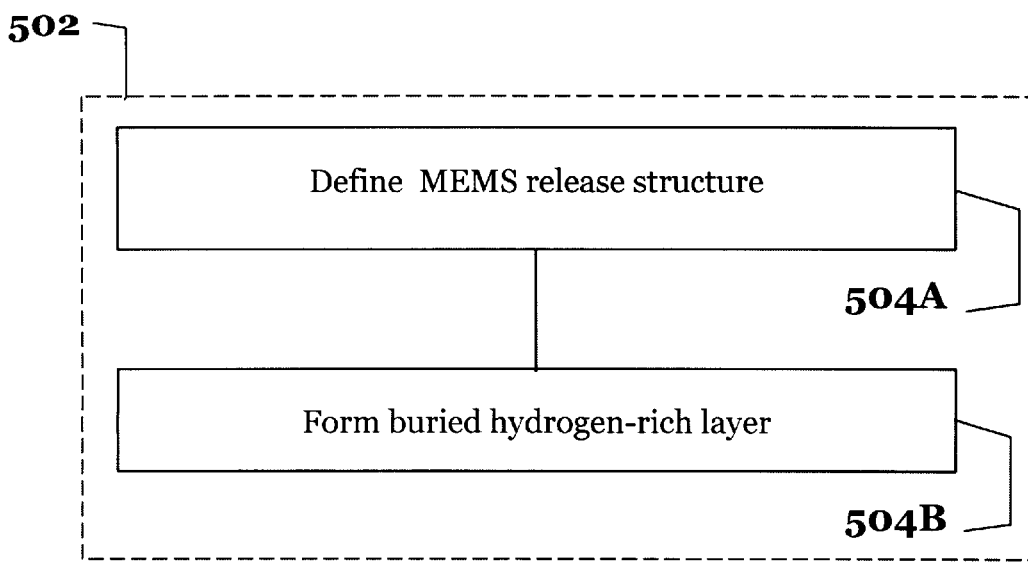

Method 500 for making a hybrid device wherein a MEMS device and a semiconductor device are fabricated on the same chip is depicted via flow chart in FIGS. 5A and 5B. This method incorporates operations of method 200 depicted in FIG. 2. Method 500 is described, for pedagogical purposes, in the context of the fabrication of an illustrative hybrid MEMS/CMOS device. FIGS. 6A–6G depict stages in the fabrication of illustrative hybrid MEMS/CMOS device 632 in accordance with the present teachings.

In accordance with operation 502 of illustrative method 500, the semiconductor device is partially fabricated. In the illustrative embodiment described here wherein the semiconductor device(s) are CMOS transistors, standard CMOS processing steps are advantageously used, which processing will typically include the following operations: photolithography, masking, deposition, etching, ion implantation or thermal diffusion of dopants, thermal oxide formation, cleaning, stripping, metallization and passivation.

Figure 6A:
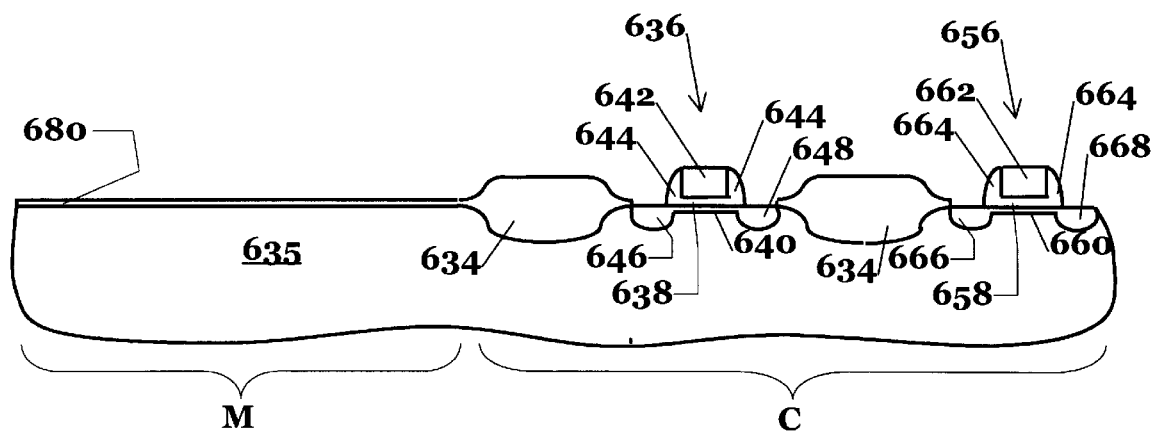
FIGS. 6A–6G depict stages in the fabrication of an illustrative hybrid micro-mechanical/CMOS device using an embodiment of the method depicted in FIGS. 5A and 5B.

FIG. 6A depicts wafer 635 with CMOS elements or CMOS region (collectively identified by the identifier "C") formed on the right side of the wafer. CMOS region C includes two illustrative transistors 636 and 656.

In one embodiment, CMOS processing begins with the formation of side electrical-insulation regions 634, such as by local oxidation of silicon ("LOCOS"). Illustrative insulation regions 634 depict the "bird's beak" regions characteristic of the LOCOS process. After forming insulation regions 634, the gate oxide region for each transistor is formed. FIG. 6A depicts gate oxide 638 of transistor 636 and gate oxide 658 of transistor 656. Insulation layer 680, which is a part of MEMS portion M of device 632, is advantageously formed on wafer 635 during gate oxide formation.

Subsequently, dopants are implanted into channel 640 of transistor 636 and into channel 640 of transistor 636 and into channel 660 of transistor 656 to adjust the threshold voltage thereof. Polysilicon gate 642 of transistor 636 and polysilicon gate 662 of transistor 656 are then formed. Portions of the gate 642 and 662 are oxidized resulting in respective sidewalls 644 and 664 that facilitate self-aligned source and drain formation.

Next, p+ implantation forms source and drain of the NMOS transistor (e.g., source 646 and drain 648 of NMOS transistor 636) and n+ implantation forms source and drain of the PMOS transistor (e.g., source 666 and drain 668 of PMOS transistor 656).

Semiconductor processing is suspended after high-temperature processing steps are completed. In the present context (i.e., CMOS), "high temperature" means 900° C. The high temperature processing steps must be completed before the buried hydrogen-rich layer is formed, since this layer is transformable by temperatures above 300° C. and perhaps even less.

Figure 6B:
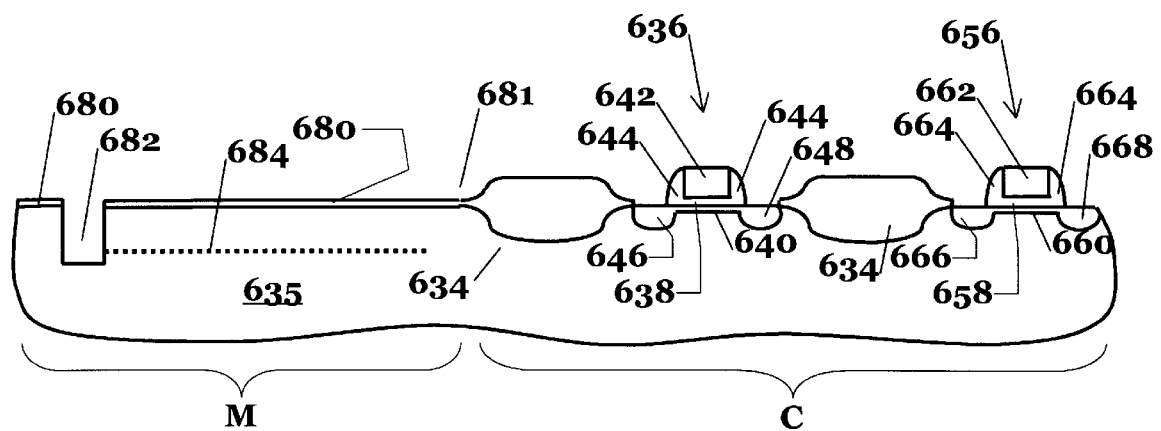

In accordance with operation 504 of method 500, the MEMS portion of the hybrid device is partially fabricated. FIG. 6B depicts wafer 635 after MEMS processing has begun.

During operation 504, a release structure is defined (operation 504A) and a buried hydrogen-rich layer is formed (operation 504B). In the illustrative hybrid device 632, step 504A is carried out by forming trench 682, which surrounds insulation 680 except at end 681 where insulation layer 680 meets side insulation 634. Trench 682 is formed, in one embodiment, by reactive ion etching. The formation of trench 682 defines the shape of the release structure. Operation 504B is carried out forming buried hydrogen-rich layer 684. The buried hydrogen-rich layer is formed as previously described (e.g., H+ implantation, etc., as appropriate).

Figure 6C:
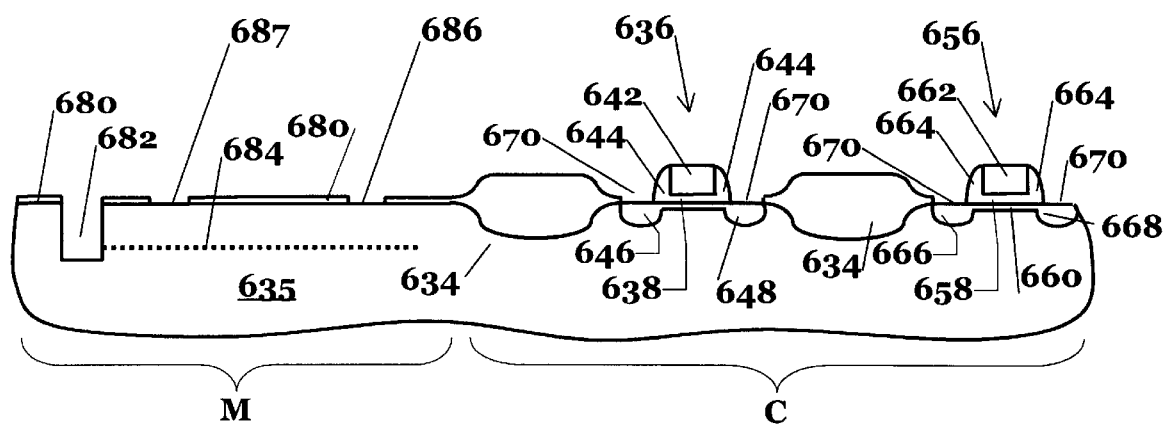

In one embodiment of illustrative method 500, after defining the release structure and forming the buried hydrogen-rich layer, both MEMS M portion and CMOS C portion of device 632 are metallized, as per operation 506. In the illustrative embodiment, in preparation for metallizing, windows for providing electrical contact to the nascent release structure and to the source and drain of each transistor are formed. FIG. 6C depicts windows 686 and 687 through insulation layer 680 and windows 670 to the source and drain of transistors 636 and 656.

Figure 6D:
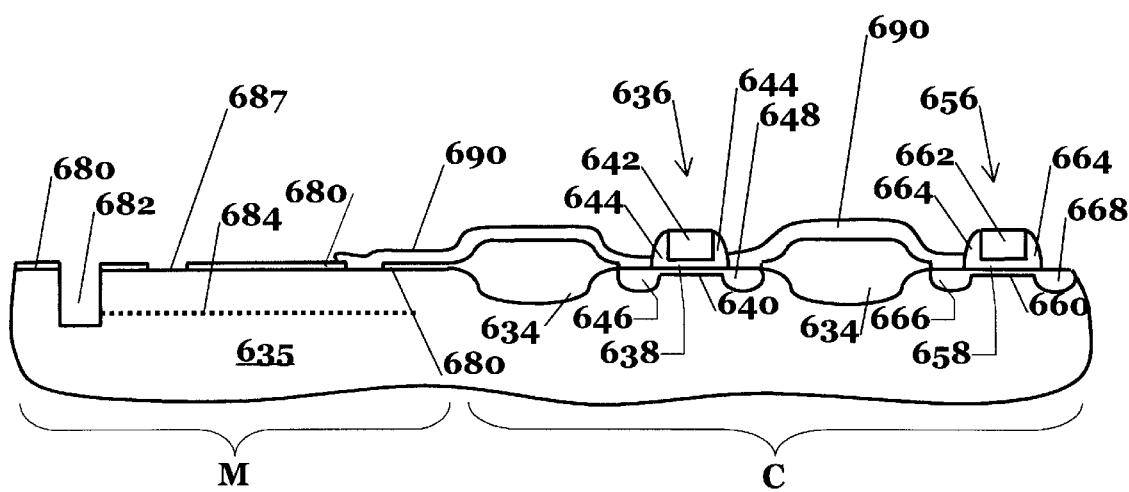

After the windows are formed, a first metallization layer 690 is deposited (FIG. 6D). In the illustrated embodiment, metallization layer 690 contacts the semiconductor portion of the nascent release structure through window 686.

Figure 6E:
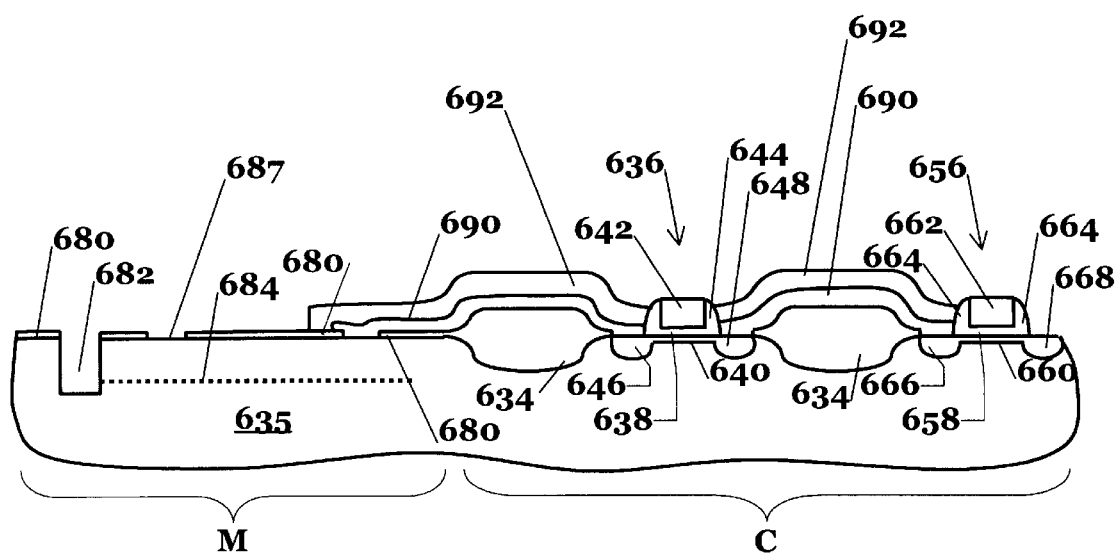
Figure 6F:
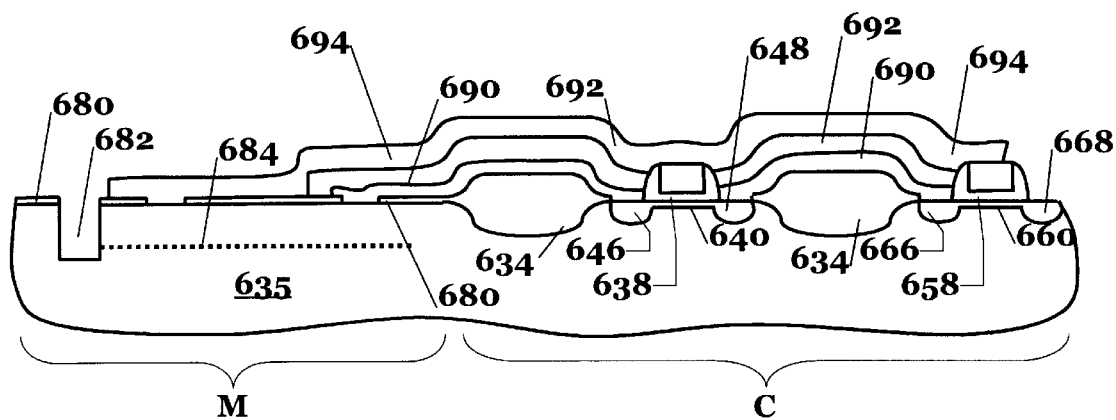

Subsequently, electrical insulation layer 692 (e.g., silicon dioxide, etc.) is deposited on metallization layer 690 (FIG. 6E). A second metallization layer 694 is then deposited on insulation layer 692. metallization layer 694 contacts the semiconductor portion of the release structure through window 687 (FIG. 6F).

Figure 6G:
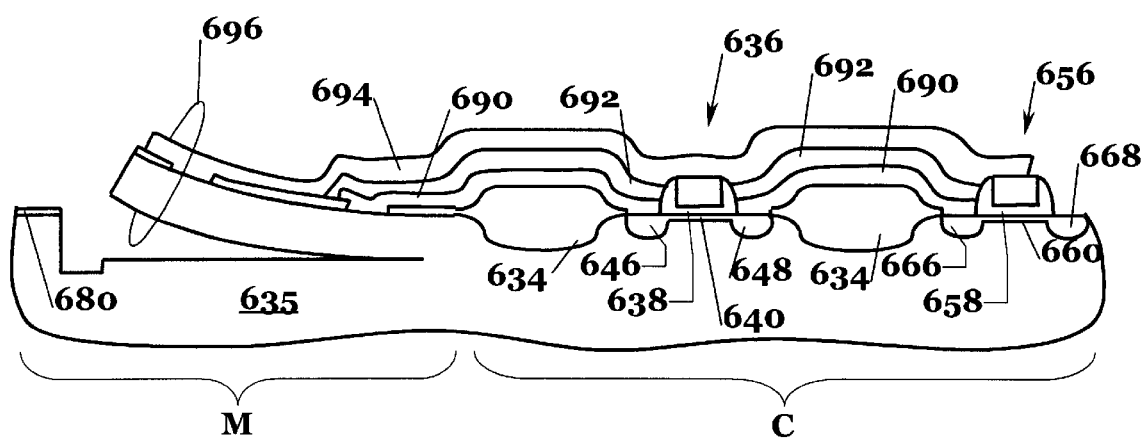

In accordance with operation 508 of method 500, the release structure is released by selectively cleaving wafer 635. This is operation is implemented by transforming buried hydrogen-rich layer 684 into a substantially continuous gaseous layer by the application of energy, such as previously described (e.g., heating the substrate to above 300° C.). Second metallization layer 694 functions as a strained layer for self release upon cleavage. In FIG. 6G, release structure 696 is depicted after self-release, bending upwardly away from wafer 635. Note that metallization layer 694 performs triple duty, as it functions as a stiffener and an electrical contact, in addition to its role as a strained layer.

In final steps, ohmic contacts to release structure 696 and to the source and drain of each of transistors 636 and 656 are formed. Device 632 is then passivated, and the wafer is typically diced into chips and encapsulated.

Release structure 696 is operable to function as a sensor, such as a piezoaccelerometer. Since there is electrical contact between release structure 696 and CMOS portion C, device 632 can operate as a "smart" sensor.

In particular, release structure 696 bends under acceleration. Such bending generates electrical potentials along release structure 696. These potentials are significantly greater than signals generated from a conventional polysilicon-based accelerometer, since the piezo effects that generate such signals in single crystal material are generally not present in amorphous material (i.e., polysilicon). Consequently, acceleration is advantageously measured with greater accuracy and over a much wider range than is possible with polysilicon-based accelerometers.

Moreover, the signal-to-noise-ratio of polysilicon accelerometers is limited by noise that is generated at grain boundaries within polysilicon. These grain boundaries trap and release electrons and holes, which activity is responsible for the noise. Due to the absence of grain boundaries in single crystalline material, accelerometers that are fabricated from such material are not subject to this source of noise.

The relatively high signal-to-noise ratio that is obtainable from a single crystalline silicon accelerometer is advantageously maintained through the use of an amplifier. The amplifier should be positioned as closely as possible to the accelerometer. In particular, the accelerometer is advantageously integrated with amplifier circuitry on a single chip, as described above in accordance with one embodiment of the present invention.

It is advantageous to "condition" the signal from the accelerometer by converting it into a digital signal. Consequently, in some embodiments, CMOS readout circuitry (not shown) that is integrated into CMOS region C includes an analog-to-digital converter. The output from the analog-to-digital converter is delivered to a signal processor (not shown) that is programmed in accordance with the intended to functioning of the accelerometer. The smart accelerometer is used, for example, to control deployment of automotive airbags and to monitor shocks during shipment of equipment, among other uses.

It should be recognized that method 500 for fabricating hybrid MEMS/CMOS devices is illustrative of the principles of the present invention. One of such principles is to use hydrogen-induced cleavage to release MEMS structures. In the present context, that principle allows for the fabrication of hybrid MEMS/semiconductor devices. The fabrication method that is described above and illustrated in FIGS. 6A–6G is simply illustrative of one way in which the CMOS portion and MEMS portion of a hybrid MEMS/CMOS device can be formed.

In a further embodiment in accordance with the present teachings, micro-mechanical structures (e.g., gears, etc.) are fabricated and filly released (i.e., removed) from a substrate using hydrogen-induced cleavage. Such fully released structures can then be used in an assemblage of other parts, such as to create, for example, a micro-motor. Stages in the fabrication and full release of a micro-mechanical structure are depicted in FIGS. 7A–7E.

Figure 7A:
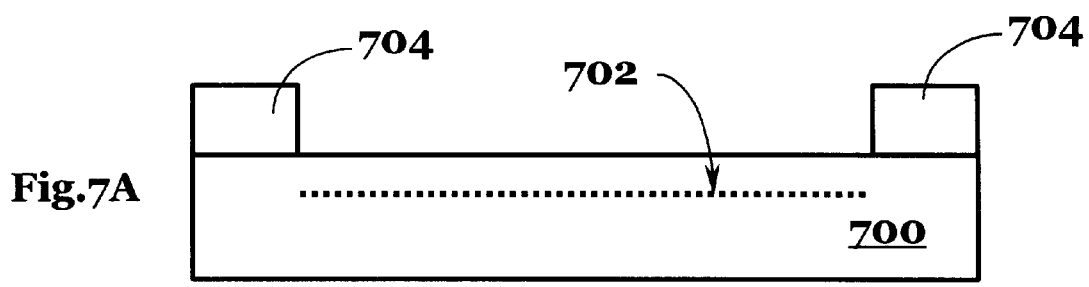
FIGS. 7A–7E depict stages in the fabrication of a further embodiment of a micro-mechanical structure in accordance with the present teachings.
Figure 7B:
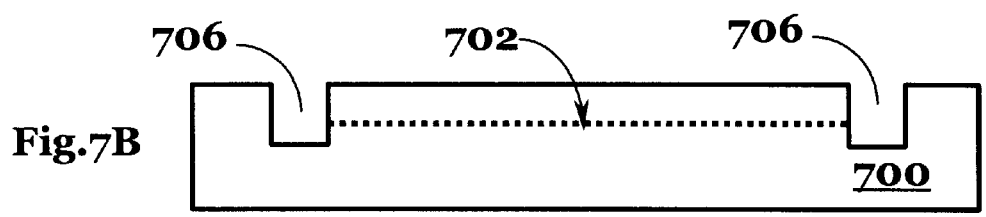
Figure 7C:
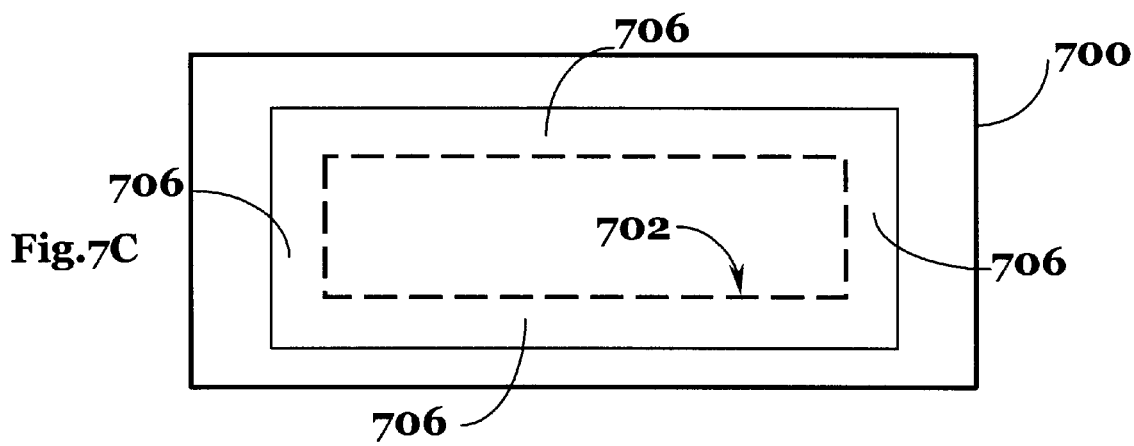

FIG. 7A depicts a cross-sectional view of wafer 700 after buried hydrogen-rich layer 702 is selectively implanted using mask 704. After mask 704 is removed, a release structure is defined by trenches 706, as depicted in FIG. 7B. Since the release structure is to be removed from wafer 700, trenches 706 will completely surround the release structure, as illustrated in FIG. 7C (top view).

Figure 7D:
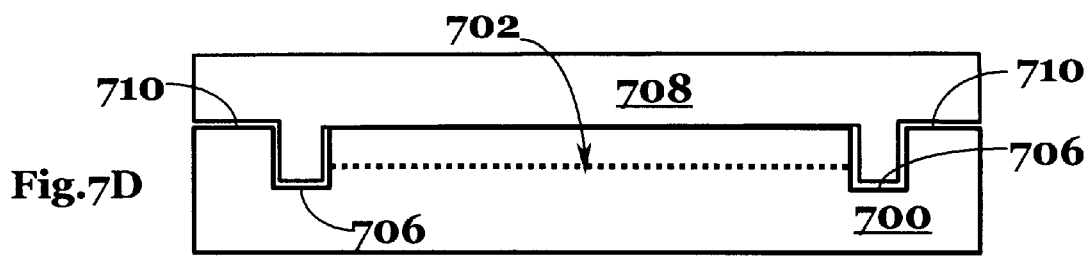
Figure 7E:
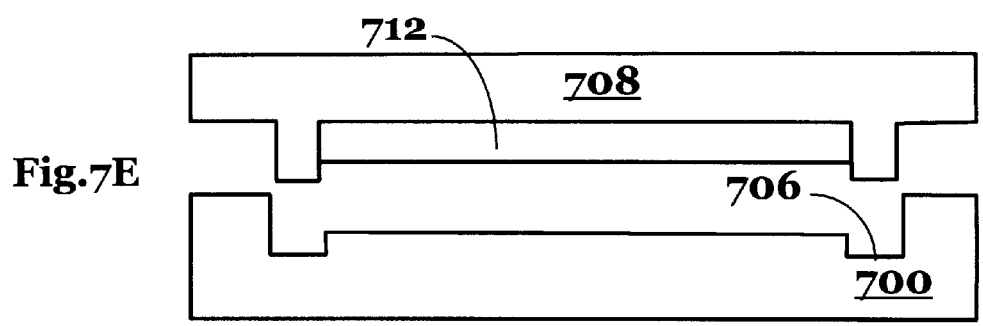

FIG. 7D depicts adhesion layer 708 disposed on the surface of wafer 700. The purpose of adhesion layer 708 is to adhere to release structure 712 (FIG. 7E) and function as a "handle" to remove the release structure after hydrogen-induced cleavage. Region 710 of wafer 700, and trenches 706 are advantageously treated with a material (not depicted) to prevent adhesion of the adhesion layer 708 to these areas so that, on release of the release structure, the adhesion layer can be disengaged from wafer 700, as depicted in FIG. 7E. In one embodiment, the material is oil and the adhesion layer is photoresist.

In one embodiment, adhesion layer 708 is formed by covering the surface of wafer 700 with photoresist, selectively irradiating the photoresist through a mask, and developing the photoresist with suitable solvent in known fashion. The photoresist is advantageously a high viscosity photoresist so that resulting layer 708 is relatively thick, which, in this context, means a layer thickness that is within a range of about 1 to 5 microns. Such thickness is chosen for convenient handling and positioning of release structure 712. Selection of suitable high viscosity photoresist is within the capabilities of those skilled in the art.

The relatively thick adhesion layer 708 serves another purpose, as well. In particular, adhesion layer 708 prevents blistering of the silicon comprising release structure 712.

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

I claim:

1. A method comprising:

forming a buried hydrogen-rich layer in a localized region within a semiconductor substrate;

defining a release structure in said semiconductor substrate above said localized region; and separating at least a portion of said release structure from said semiconductor substrate at said buried hydrogen-rich layer.

2. The method of claim 1 wherein said semiconductor substrate comprises single crystalline silicon.

3. The method of claim 1 wherein said step of forming comprises implanting hydrogen derived ions in said semiconductor substrate.

4. The method of claim 1 wherein said step of defining comprises forming trenches in said semiconductor substrate.

5. The method of claim 4 wherein said step of defining comprises forming said trenches to a depth in said semiconductor substrate that is at least as deep as said buried hydrogen-rich layer.

6. The method of claim 5 wherein said step of defining comprises forming said trenches partially, but not completely, around a perimeter of said release structure so that said release structure remains tethered to said semiconductor substrate.

7. The method of claim 1 wherein said step of separating comprises transforming said buried hydrogen-rich layer into a substantially continuous gaseous layer.

8. The method of claim 1 wherein said step of separating comprises applying energy to said buried hydrogen-rich layer.

9. The method of claim 8 wherein said step of separating comprises increasing a temperature of said buried hydrogen-rich layer to more than about 300° C.

10. The method of claim 1 wherein said step of separating further comprises self-releasing said release structure.

11. The method of claim 10 wherein said step of self-releasing comprises disposing a strained layer on said release structure before release.

12. The method of claim 11 wherein said strained layer comprises aluminum.

13. The method of claim 1 further comprising passivating cleavage surfaces that are formed as a result of said step of separating at least a portion of said release structure from said semiconductor substrate.

14. The method of claim 1 wherein said buried hydrogen-rich layer is formed in a first part of said semiconductor substrate, the method further comprising forming a semiconductor device in a second part of said semiconductor substrate.

15. A method comprising:

forming a buried hydrogen-rich layer in a semiconductor substrate;

defining a release structure in said semiconductor substrate; and effecting site-specific cleavage of said semiconductor substrate thereby releasing said release structure;

wherein a portion of said release structure remains attached to said semiconductor substrate after said site-specific cleavage.

16. The method of claim 15 wherein said semiconductor substrate comprises mono crystalline silicon.

17. A method comprising:

forming a portion of a semiconductor device at a first location on a substrate; and forming a portion of a MEMS device at a second location on said substrate, said formed portion of said MEMS device comprising:
a release structure; and
a buried hydrogen-rich layer.

18. The method of claim 17 further comprising depositing metal on said portion of said semiconductor device and said portion of said MEMS device.

19. The method of claim 18 further comprising adding energy to said buried hydrogen-rich layer to release said release structure.

20. The method of claim 17 wherein said step of forming a portion of a semiconductor device is suspended after processing operations that take place above about 900° C. are completed.

21. The method of claim 17 wherein said step of forming a semiconductor device further comprises forming a transistor.

22. The method of claim 18 further comprising electrically connecting said MEMS device to said semiconductor device via said deposited metal.

* * * * *